United States Patent [19]

Akimoto

[11] Patent Number: 5,772,764
[45] Date of Patent: Jun. 30, 1998

[54] COATING APPARATUS

[75] Inventor: Masami Akimoto, Kumamoto, Japan

[73] Assignee: Tokyo Electron Limited, Tokyo, Japan

[21] Appl. No.: 729,028

[22] Filed: Oct. 9, 1996

[30]     Foreign Application Priority Data

Oct. 13, 1995  [JP]  Japan ..................................... 7-292131

[51] Int. Cl.$^6$ .............................. B05B 13/02; B05B 7/16;
                                        B05B 15/02; B05B 13/04
[52] U.S. Cl. .......................... 118/319; 118/302; 118/320;
         118/52; 118/54; 239/549; 239/550; 239/551;
                                                           239/556
[58] Field of Search ............................... 118/52, 54, 302,
                    118/319, 320; 239/549, 550, 551, 556

[56]               References Cited

U.S. PATENT DOCUMENTS

| 4,564,280 | 1/1986 | Fukuda ..................................... 354/317 |
| 5,002,008 | 3/1991 | Ushijima et al. . |
| 5,089,305 | 2/1992 | Ushijima et al. . |
| 5,374,312 | 12/1994 | Hasebe et al. ............................. 118/52 |
| 5,449,405 | 9/1995 | Cardinali et al. .......................... 118/50 |

FOREIGN PATENT DOCUMENTS

| 2-132444 | 5/1990 | Japan . |
| 4-236419 | 8/1992 | Japan . |
| 4-363015 | 12/1992 | Japan . |

*Primary Examiner*—Peter Chin
*Assistant Examiner*—Jacqueline A. Ruller
*Attorney, Agent, or Firm*—Oblon, Spivak, McClelland, Maier & Neustadt, P.C.

[57]               ABSTRACT

A coating apparatus comprises a spin chuck for holding and rotating a substrate, a header unit movable along a linear line connecting a position just above a center-of-rotation of the substrate, to a home position of the unit, a plurality of nozzles included in the header unit for discharging coating liquids to the substrate held on the spin chuck, the first nozzles having their respective nozzle ports arranged in line along the linear line, and a plurality of coating liquid supply means for supplying the coating liquids to the first nozzles, respectively.

14 Claims, 5 Drawing Sheets

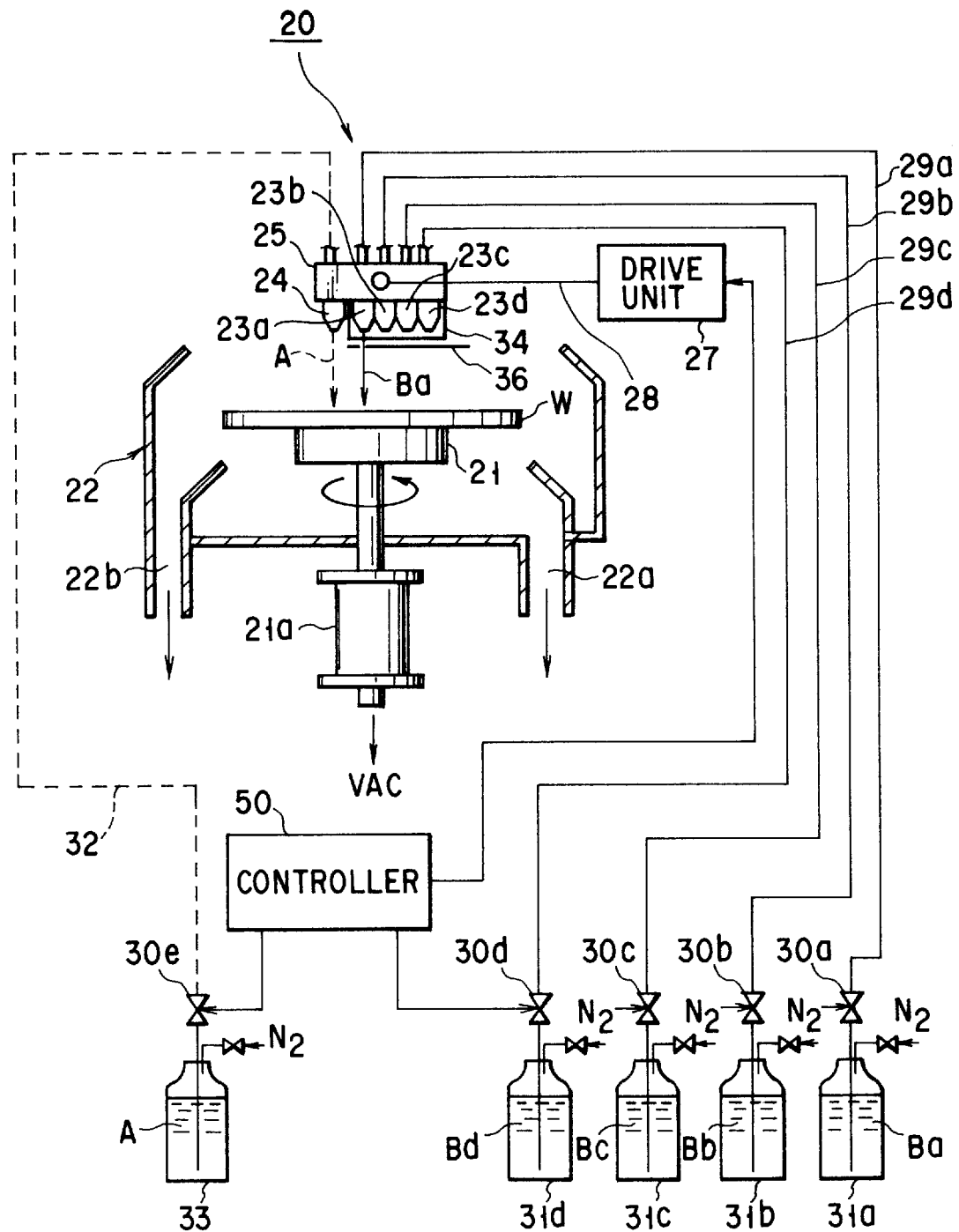
F I G. 2

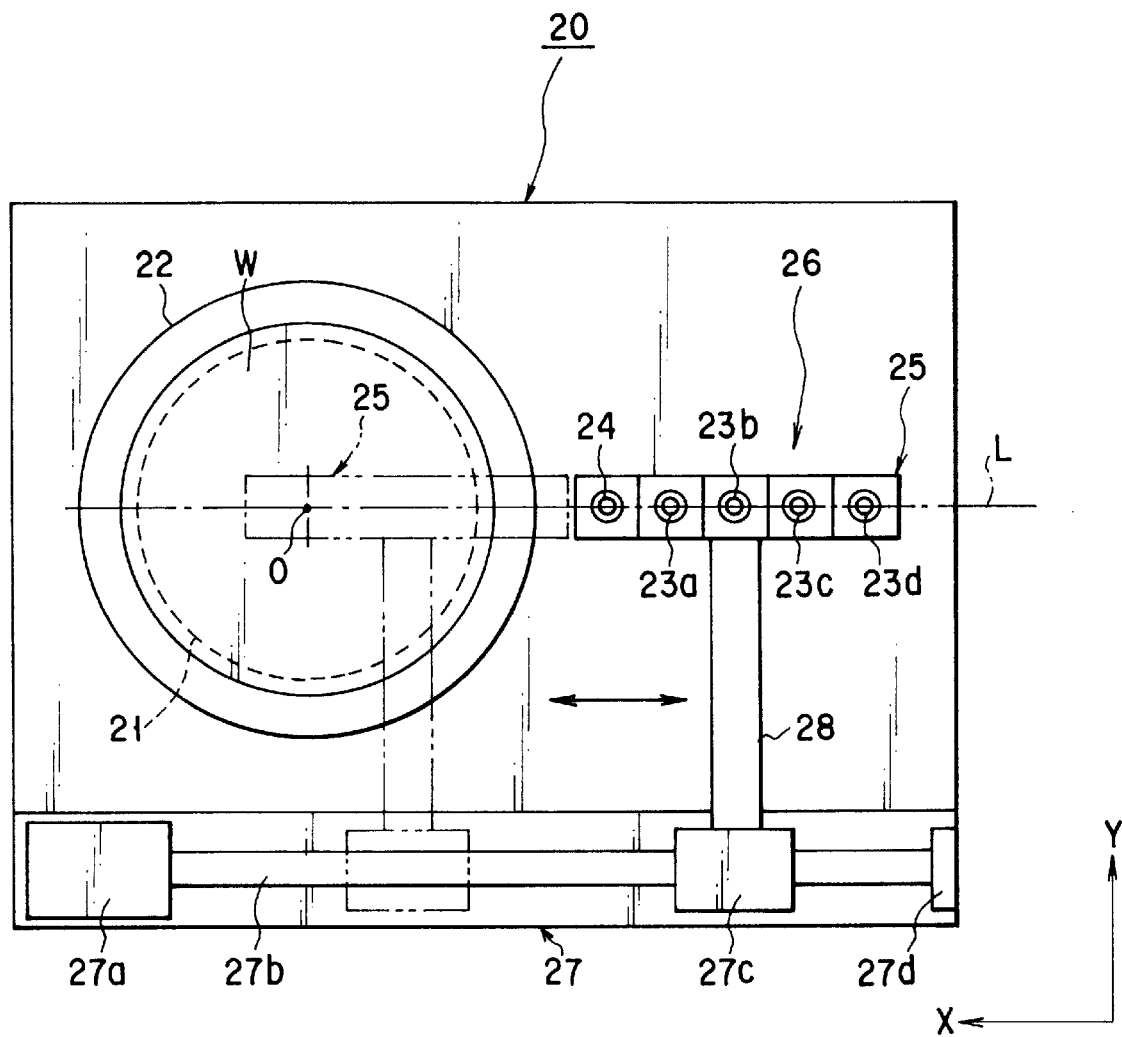
F I G. 3

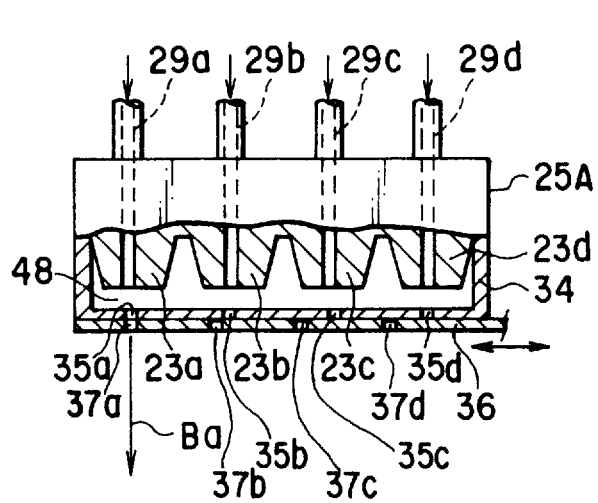
F I G. 6
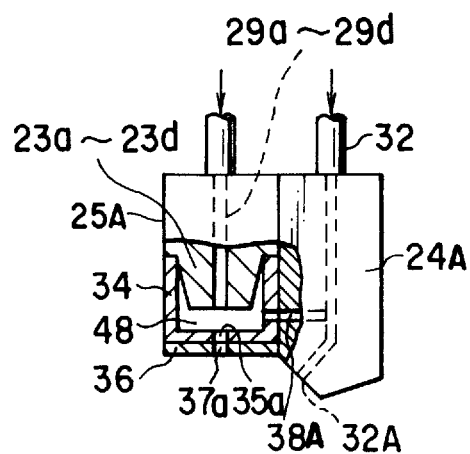
F I G. 7
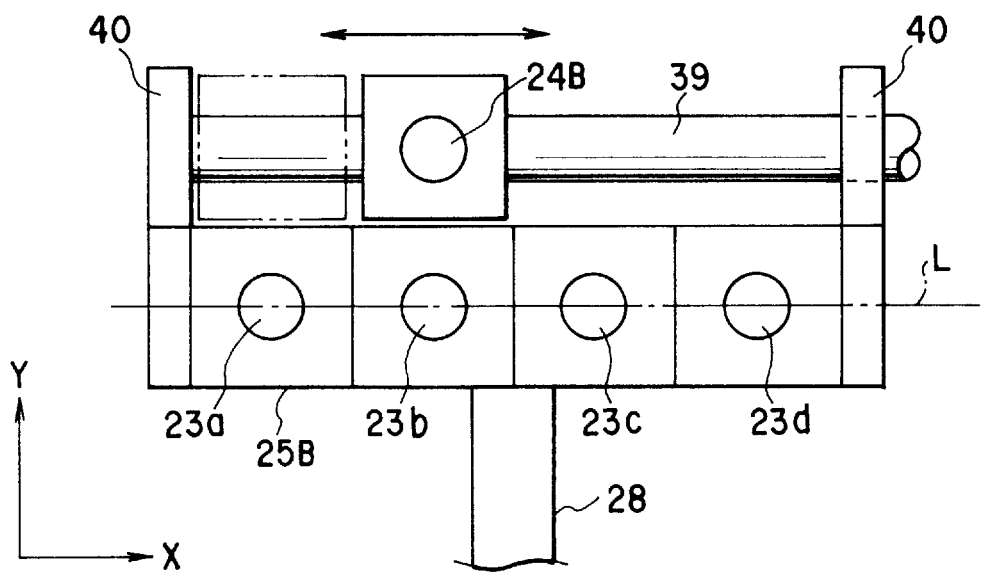
F I G. 8

COATING APPARATUS

BACKGROUND OF THE INVENTION

1. Field of the Invention

This invention relates to a coating apparatus for coating the surface of a substrate with various resist liquids.

2. Description of the Related Art

In the manufacture of a semiconductor device, a desired resist film is formed by coating the surface of a wafer W with a resist liquid. The resist film is then exposed to light and developed to form a circuit pattern. The coating of the resist liquid is performed by placing the wafer W on a spin chuck and applying the resist liquid thereto while rotating the spin chuck.

There are various types of resist liquids to be coated. An appropriate one of the resist liquids is selected, for example, in the following manners 1)–4): 1) to select in accordance with a backing layer formed on the wafer; 2) to select on the basis of whether the coating process requires high accuracy or relatively low accuracy; 3) to select on the basis of whether the to-be-coated surface is a hole surface or a line surface; and 4) to select in accordance with the selective ratio of etching, the thickness of a to-be-coated resist film, etc.

Conventional coating apparatuses include a one equipped with an angularly-movable nozzle transfer mechanism, and a one equipped with a linearly-movable nozzle transfer mechanism. In the angularly-movable mechanism, a desired one of a plurality of resist liquid nozzles, which are retreated in respective retreat (home) positions, is held by a swing arm, and angularly moved to a position above a wafer as a result of swing movement of the arm. On the other hand, in the linearly-movable mechanism, a desired one of a plurality of resist liquid nozzles, which are retreated in respective retreat positions, is held by a scan arm, and linearly moved to a position above a wafer as a result of linear movement of the arm.

Thus, the conventional coating apparatuses require a series of operations—selecting a to-be-used one from retreated nozzles, holding it, transferring it, positioning it above a wafer, and applying a resist liquid to the wafer. Moreover, it takes a great amount of time to position the selected nozzle above the wafer. This being so, the throughput in the coating process is less than those in other processes performed simultaneous therewith.

In addition, since in the conventional coating apparatuses, the resist liquid remains at the discharge port of each nozzle, particles of the liquid may well be adhered to the discharge port and/or its vicinity. The adhered particles may be applied to the wafer together with the resist liquid, thereby contaminating the wafer. As a result, the yield of resultant products is inevitably low.

SUMMARY OF THE INVENTION

It is the object of the invention to provide a coating apparatus capable of coating substrates with a resist liquid at high throughput and yield.

To attain the object, there is provided a coating apparatus comprising:

a spin chuck for holding and rotating a substrate;

a header unit movable along a linear line connecting a position just above a center-of-rotation of the substrate, to a home position of the unit;

a plurality of first nozzles included in the header unit for discharging coating liquids to the substrate held on the spin chuck, the first nozzles having their respective nozzle ports arranged in line along the linear line; and a plurality of coating liquid supply means for supplying the coating liquids to the first nozzles, respectively.

Preferably, the apparatus of the invention further comprises at least one second nozzle included in the header unit together with the first nozzles, for discharging, to the substrate, a solvent for solving the coating liquids, and solvent supply means for supplying the solvent to the second nozzle.

More preferably, the apparatus of the invention further comprises:

a cover member defining an inner space around the nozzle ports of the first nozzles and protecting the nozzle ports from an outside atmosphere;

a slide lid attached to the lower surface of the cover member such that it can slide along the lower surface;

a plurality of first holes formed in the cover member such that they are aligned with the nozzle ports of the first nozzles, respectively; and a plurality of second holes formed in the slide lid with a pitch different from the pitch of the first holes.

In the apparatus constructed as above, the slide lid is slided to thereby make one of the first holes communicating with one of the second holes and permit a coating liquid from one of the first nozzles to be discharged through the communicating ones of the first and second holes toward the substrate. By virtue of this structure, the nozzle ports of the coating liquid nozzles can be kept in the atmosphere of a solvent, and therefore be protected from contamination due to particles of the coating liquid, etc.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a schematic block diagram, showing a coating apparatus according to a first embodiment of the invention;

FIG. 3 is a plan view of the coating apparatus as viewed from above;

FIG. 6 is a partially sectional elevation, showing a header unit according to a second embodiment of the invention;

FIG. 7 is a partially sectional side elevation, showing the header unit according to the second embodiment; and FIG. 8 is a plan view of a header unit according to a third embodiment, as viewed from above.

DETAILED DESCRIPTION OF THE PREFERRED EMBODIMENTS

The preferred embodiments of the invention will be described with reference to the accompanying drawings. In the embodiments, the coating apparatus of the invention is applied to a resist coating/developing system for semiconductor wafers.

Figure 1:
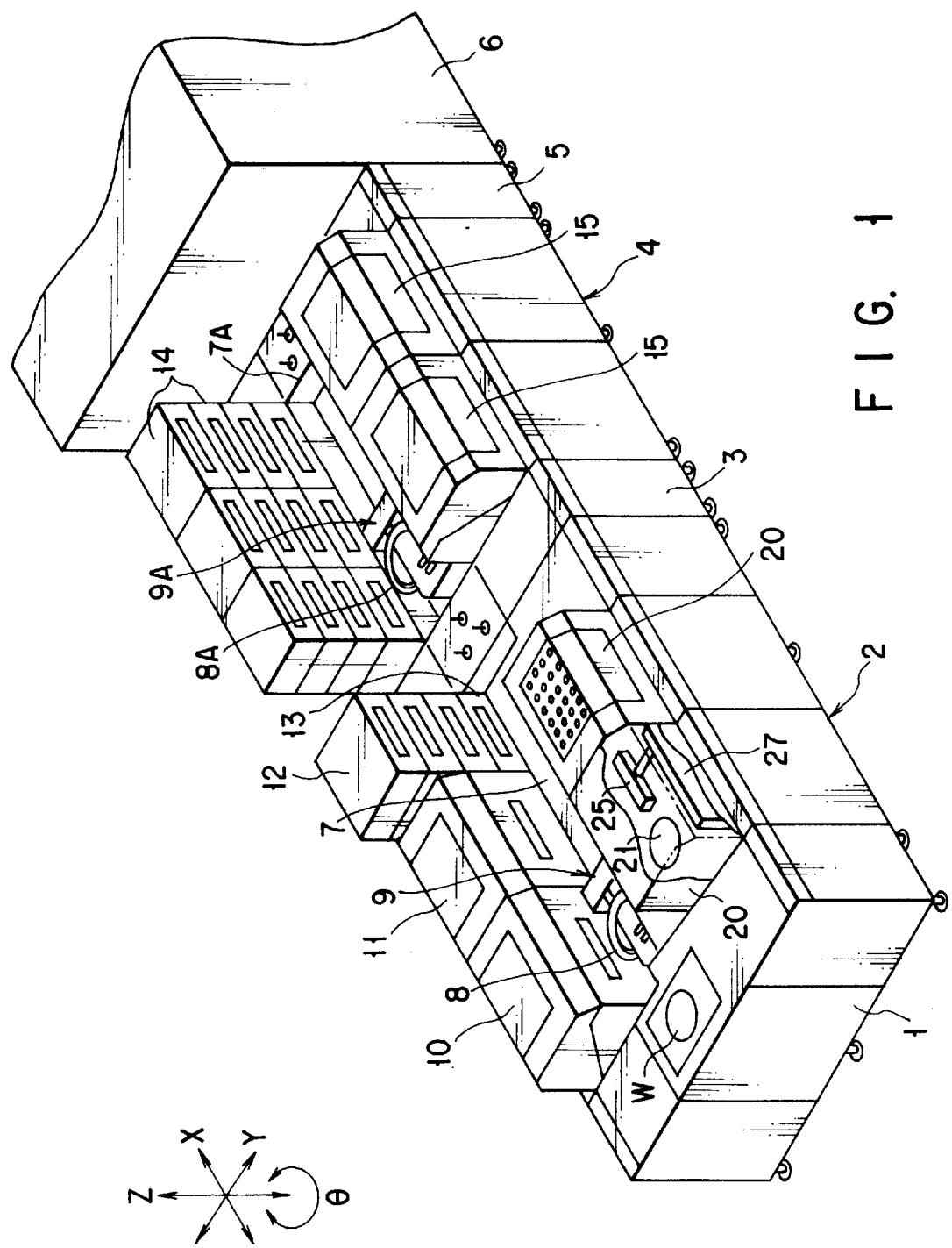
FIG. 1 is a schematic perspective view, showing the outline of a resist-coating developing apparatus.

As is shown in FIG. 1, the resist coating/developing system comprises a loader section 1, first and second process sections 2 and 4, first and second interface sections 3 and 5, and an exposure section 6. Wafer cassettes (not shown) are transferred into or out of the loader section 1 by means of a transfer unit (not shown). Each cassette contains, for example, 25 semiconductor wafers W.

The loader section 1 has a handling unit (not shown) and a stage. Each wafer W taken out of the cassette by the handling unit is placed on the stage. The stage includes a positioning mechanism (not shown) for positioning the wafer W on the stage with respect to the process sections 2 and 4.

The first process section 2 is provided adjacent to the loader section 1, and has a plurality of process units 10, 11, 12 and 20, a main transfer unit 9 and a center passage 7. The main transfer unit 9 is disposed movable in the X-axis direction along the center passage 7, and has an arm 8 for holding each wafer W. The arm 8 is supported by a driving mechanism (not shown) such that it can move in the X-, Y- and Z-axis directions and rotate through θ about the Z-axis. The process units 10, 11, 12 and 20 are provided along the opposite sides of the passage 7, and have their wafer-inlets or wafer-outlets opening toward the passage 7. Specifically, a brush cleaning unit 10, a jet water cleaning unit 11, an adhesion unit 12 and a cooling unit 13 are arranged along one side of the passage 7, while two resist coating units 20 are arranged along the other side of the passage 7.

The second process section 4 is provided adjacent to the first process section 2 with the first interface section 3 interposed therebetween. The second process section 4 has a plurality of units 14 and 15, a main transfer unit 9A and a center passage 7A. The main transfer unit 9A and the center passage 7A are substantially identical to the main transfer unit 9 and the center passage 7, respectively. Three heating units 14 are arranged along one side of the passage 7A. The heating units 14 are used to perform a pre-bake treatment or a post-bake treatment to heat a wafer W before or after resist coating. Further, two developing units 15 are arranged along the other side of the passage 7A.

The exposure section 6 is provided adjacent to the second process section 4 with the second interface section 5 interposed therebetween. Each of the first and second interface sections 3 and 5 has a plurality of vertically-movable support pins. These pins support the wafer W and enable the same to be transferred between the transfer units 9 and 9A.

Referring then to FIGS. 2 to 5, the coating apparatus of the first embodiment will be described.

As is shown in FIG. 2, the coating unit 20 comprises a spin chuck 21, a cup 22, a header unit 25 and a drive unit 27. The spin chuck 21 has a vacuum suction mechanism (not shown) for holding the wafer W by a suction force, and a rotary mechanism 21a for spinning the wafer W about the Z-axis. The cup 22 is a cylindrical member with a bottom surface, which surrounds the spin chuck 21. The bottom surface has an exhaust port 22a and a drain port 22b formed therein.

The header unit 25 has four resist liquid nozzles 23a–23d and a single cleaning liquid nozzle 24. These nozzles 23a–23d and 24 are molded as one body out of a chemically resistant resin or a corrosion resistant metal. The header unit 25 can be moved by the drive unit 27 in the X-axis direction.

The first through fourth nozzles 23a–23d communicate with first through fourth resist liquid tanks 31a–31d, respectively. The first through fourth tanks 31a–31d contain different kinds of resist liquids Ba, Bb, Bc and Bd, which consist, for example, of a chemical amplification type resist liquid, a novolak-based resist liquid, etc.

The fifth nozzle 25 communicates with a cleaning liquid tank 33 via a passage 32. The tank 33 contains a thinner A as a solvent of the resist liquids.

The tanks 31a–31d and 33 respectively communicate with pressurizing gas passages for introducing a pressurized non-oxidizing gas such as $N_2$. When pressurized $N_2$ gas is introduced into the tanks, the liquids A and Ba–Bd are force-fed into the nozzles 23a–23d and 24 via passages 29a–29d and 32, respectively. Flow adjusting valves 30a–30e are provided across the passages 29a–29d and 32, respectively, and have their power switches connected to the output section of a controller 50.

Referring to FIG. 3, the drive unit 27 will be described.

In the header unit 25, the first through fifth nozzles 23a–23d and 24 are linearly arranged on a line L parallel to the X-axis and passing the center-of-rotation O of the spin chuck 21. The drive unit 27 includes a Y-axis arm 28, which has a distal end thereof coupled with a center portion of the header unit 25, and a proximal end coupled with a ball nut 27c. The ball nut 27c is screwed on an X-axis screw 27b. The X-axis screw 27b extends between the opposite ends of the long side of the coating apparatus 20, and has its one end coupled with the drive shaft (not shown) of a motor (not shown) via a deceleration gear (not shown) in a gear box 27a, and the other end rotatably coupled with a stopper 27d. The motor has its power switch connected to the controller 50. When the X-axis screw 27b is rotated about the X-axis, the header unit 25 is X-axially moved from its home position 26 to a position above the spin chuck 21.

Figure 4:
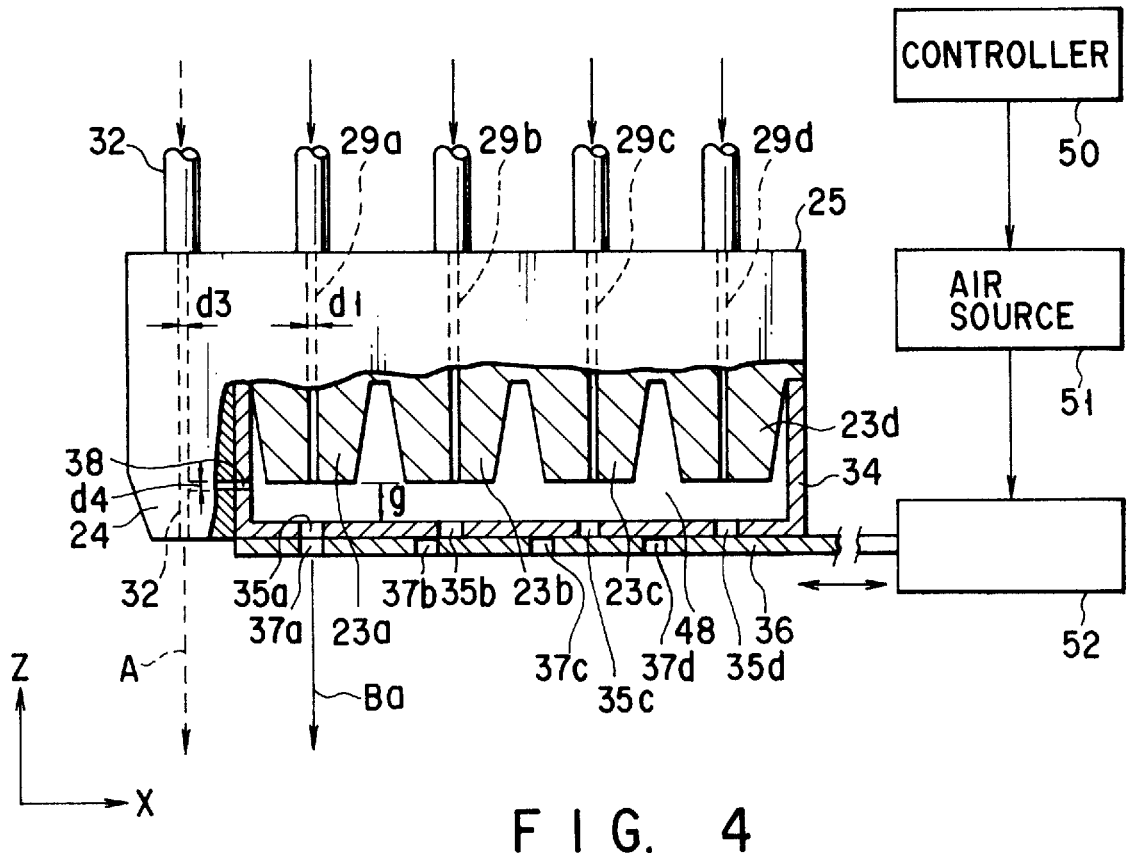
FIG. 4 is a partially sectional view, showing part of a header unit.
Figure 5:
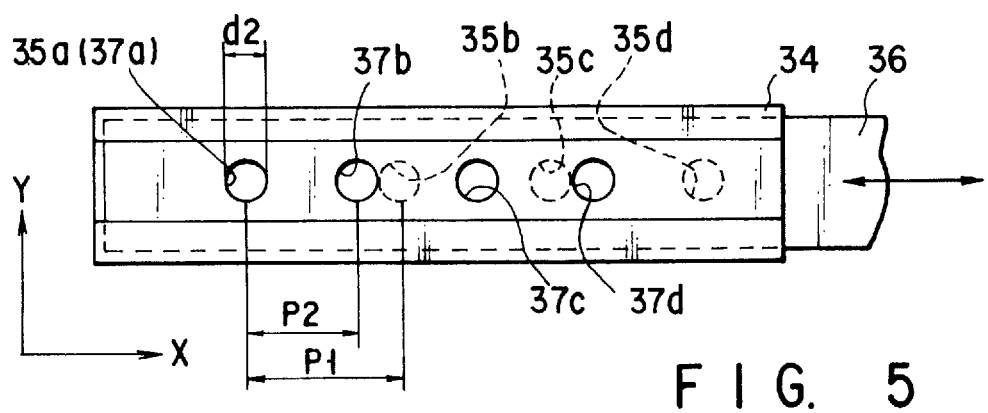
FIG. 5 is a plan view, showing a bottom portion of the header unit.

Referring then to FIGS. 4 and 5, the header unit 25 will be described in more detail.

The header unit 25 has a resist liquid discharge portion and a cleaning liquid discharge portion. The resist liquid discharge portion is covered with a cover member 34, such that the nozzle ports of the first through fourth nozzles 23a–23d are not exposed to the outside atmosphere. A small space 48 is defined between the cover member 34 and the nozzle ports of the first through fourth nozzles 23a–23d. The space 48 communicates with the fifth nozzle 24 through a branch passage 38, which is formed in a side portion of the cover member 34 for horizontally discharging the cleaning liquid A to directly apply it to the nozzle ports of the nozzles 23a–23d. The main passage 32 of the fifth nozzle 24 extends linearly and downwardly to the bottom of the header unit 25.

Four holes 35a–35d are formed in the bottom of the cover member 34 with a pitch $P_1$. The locations of the holes 35a–35d correspond to the nozzle ports of the first through fourth nozzles 23a–23d, respectively. A lid 36 is attached to the bottom of the cover member 34 such that it is movable in the X-axis direction. One end of the lid 36 is coupled with the piston rod of a cylinder 52. The cylinder 52 communicates with an air supply 51, which is controlled by the controller 50.

As is shown in FIG. 5, the lid 36 has four communication holes 37a–37d formed therein with a pitch $P_2$ which is smaller than the pitch $P_1$ of the holes 35a–35d. The diameter $d_2$ of each of the holes 35a–35d and 37a–37d is larger than the diameter $d_1$ of the passages 29a–29d. Preferably, the diameter $d_2$ is twice or three times the diameter $d_1$.

Since the holes 35a–35d are not arranged with the same pitch as the communication holes 37a–37d, if, for example, the first hole 35a is aligned with the first communication hole 37a, the other holes 35b–35d are covered with the wall of the lid 36. In this state, the resist liquid Ba discharged from the nozzle port of the first nozzle 23a reaches the wafer W through the first holes 35a and 37a. Instead of the lid 36 having the communication holes 37a–37d arranged with the pitch $P_2$, independent lids for respectively opening and closing the holes 35a–35d may be employed.

As is shown in FIG. 4, the passage 38 formed in a side portion of the cover member 34 branches off at substantially right angles from the main passage 32 of the fifth nozzle 24 and communicates with the inner space 48. Vapor of the thinner A enters the space 48 through the branch passage 38, thereby keeping the nozzle ports of the nozzles 23a–23d wet with the thinner A. Therefore, the resist liquids Ba–Bd are prevented from being dried within the passages 29a–29d in the standby state.

The diameter $d_3$ of the main passage 32 of the fifth nozzle 24 is equal to the diameter $d_1$ of the resist liquid passages 29a–29d. The diameter $d_4$ of the branch passage 38 is equal to or slightly larger than the diameter $d_3$ of the main passage 32. Further, it is preferable to set between 2 mm and 10 mm the gap g between each of the nozzle ports of the nozzles 23a–23d and a corresponding one of the holes 35a–35d of the cover member 34. If the gap g is too narrow, the liquid may well bridge the gap. If, on the other hand, the gap g is too wide, it is hard to fill the space 48 with oversaturated vapor of the thinner A.

The operation of the above-described coating apparatus will now be described.

A wafer W having being positioned is placed on the spin chuck 21 and held thereon by a vacuum suction force. The header unit 25 is moved along the line L in the X-axis direction, and the fifth nozzle 24 is positioned above the center-of-rotation O of the wafer W. Then, the thinner A is applied from the fifth nozzle 24 to the wafer W. The wafer W is rotated to diffuse the applied thinner A over its entire surface. The rotation of the wafer W is stopped, and the header unit 25 is moved in the X-axis direction, thereby positioning, above the center-of-rotation O, one selected from the first through fourth nozzles 23a–23d, e.g. the first nozzle 23a. Thereafter, the lid 36 is slided in the X-axis direction to align the first communication hole 37a with the first hole 35a. In this state, the resist liquid Ba is discharged from the first nozzle 23a. The resist liquid Ba is applied to the wafer W through the holes 35a and 37a. The wafer W is rotated to diffuse the applied resist liquid Ba over its entire surface. Thus, a resist film of a uniform thickness is formed on the entire surface of the wafer W.

The resist liquid Ba is discharged after the thinner A is diffused over the wafer W to a certain extent. In other words, the thinner A needs to reach a peripheral portion of the wafer W before the resist liquid Ba does. The resist liquid Ba may be discharged so that it will follow the thinner A being diffusing.

By virtue of the linear arrangement of the resist liquid nozzles 23a–23d, they can be easily and reliably moved to a position just above the center-of-rotation O of the wafer W.

Moreover, since the resist liquid nozzles 23a–23d are formed integral as one body, any one of the nozzles can be promptly positioned above the center-of-rotation O of the wafer W in the case of coating the wafer with different resist liquids. In other words, the nozzles 23a–23d can be promptly switched from one to another, thereby enhancing the throughput.

Furthermore, since the nozzle ports of the resist liquid nozzles 23a–23d are protected from the outside atmosphere by means of the cover member 34 and the lid 36, and the inner space 48 is filled with vapor of the solvent (the thinner A), adhesion of particles, etc. to the nozzle ports can be avoided, and also the quality of the resist liquid can be prevented from deterioration.

An apparatus according to a second embodiment will be described with reference to FIGS. 6 and 7.

In a header unit 25A employed in the second embodiment, a solvent nozzle 24A for applying a solvent A to the wafer W is attached to one side of each of the first through fourth nozzles 23a–23d. As is shown in FIG. 7, the main passage 32A of the fifth nozzle 24A is bent such that its nozzle port is directed toward the first through fourth nozzles 23a–23d. The solvent A is discharged through the bent main passage 32A to a position near each of the resist liquids Ba–Bd discharged from the nozzles 23a–23d.

In the header unit 25A constructed as above, only the positioning of the resist liquid nozzles 23a–23d enables the solvent (thinner) A to be applied to the wafer W and diffused thereon, thereby enhancing the wettability of each resist liquid to the wafer W and therefore effectively coating the wafer W with the resist liquid.

Referring then to FIG. 8, a header unit according to a third embodiment will be described.

In a header unit 25B according to the third embodiment, there is provided a solvent nozzle 24B which can be moved by X-directional moving mechanisms 39 and 40 along the resist liquid nozzles 23a–23d. More specifically, the nozzle 24 is disposed to be slidable along a guide bar 39 provided on a line La parallel to a line L aligned with the center-of-rotation O of the wafer W, on which the nozzles 23a–23d are arranged. The nozzle 24 can be moved to a position near a desired one of the nozzles 23a–23d. The guide bar 39 is rotatably supported by a pair of brackets 40 projecting from the header unit 25B.

Thus, provision of the solvent nozzle 24B movable along the resist liquid nozzles 23a–23d enables the thinner A to be supplied to a position nearer to each of the resist liquids Ba–Bd, thereby more effectively coating the wafer with the resist liquid.

Although in the above-described embodiments, the invention is applied to a coating/developing system for semiconductor wafers, the invention may be applied to an apparatus for performing only coating, or to a coating apparatus for coating an LCD glass substrate or a CD substrate with a resist liquid.

In the invention, a plurality of resist liquid nozzles arranged linear and integral with each other as one body can easily and reliably be moved to a position aligned with the center-of-rotation O of the wafer W, thereby coating the wafer W with different kinds of resist liquids safely with high throughput.

Moreover, since the resist liquid nozzles are formed integral, a desired one of the nozzles can be promptly positioned above the center-of-rotation O of the wafer W at the time of coating the wafer with different kinds of resist liquids. In other words, different kinds of nozzles can be promptly switched from one to another, which enhances the throughput.

In addition, the cover member and the lid protect the nozzle port of each resist liquid nozzle from the outside atmosphere, thereby preventing adhesion of particles, etc. to the nozzle port.

Also, since the solvent (thinner) nozzle is movable along the coating (resist) liquid nozzles, a solvent can be discharged to a position near a coating liquid discharged from each coating liquid nozzle.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A coating apparatus comprising:

a spin chuck for holding and rotating a substrate;

a header unit movably along a linear line connecting a position just above a center-of-rotation of the substrate, to a home position of the unit along the linear line;

a plurality of first nozzles included in the header unit for discharging coating liquids to the substrate held on the spin chuck, the first nozzles having their respective nozzles ports arranged in line along the linear line;

a plurality of coating liquid supply means for supplying the coating liquids to the first nozzles, respectively;

at least one nozzle included in the header unit together with the first nozzles, for discharging, to the substrate, a solvent for solving the coating liquids in order to wet the substrate with the solvent before coating the coating liquids; and solvent supply means for supplying the solvent to the second nozzle.

2. The apparatus according to claim 1, wherein the at least one second nozzle has a nozzle port arranged in line with the nozzle ports of the first nozzles along the linear line.

3. The apparatus according to claim 1, wherein the at least one second nozzle has a nozzle port and a passage formed therein, the passage being bent such that the nozzle port is directed toward the nozzle ports of the first nozzles.

4. The apparatus according to claim 1, further comprising a nozzle moving mechanism for moving the second nozzle along the first nozzles and positioning the second nozzle adjacent to each of the first nozzles.

5. The apparatus according to claim 1, further comprising:

a cover member defining an inner space around the nozzle ports of the first nozzles and protecting the nozzle ports from an outside atmosphere;

a slide lid attached to the lower surface of the cover member such that it can slide along the lower surface;

a plurality of first holes formed in the cover member such that they are aligned with the nozzle ports of the first nozzles, respectively; and a plurality of second holes formed in the slide lid with a pitch different from the pitch of the first holes;

and wherein the slide lid is slided to thereby make one of the first holes communicating with one of the second holes and permit a coating liquid from one of the first nozzles to be discharged through the communicating ones of the first and second holes toward the substrate.

6. The apparatus according to claim 5, wherein the second nozzle has a main passage extending to its nozzle port for discharging a coating liquid to the substrate, and a branch passage branching off from the main passage and communicating with the inner space, and a solvent and its vapor is supplied into the inner space through the branch passage.

7. The apparatus according to claim 6, wherein the branch passage communicates with the inner space so that the solvent and its vapor is directly applied to the nozzle ports of the first nozzles.

8. The apparatus according to claim 1, wherein the plurality of coating liquid supply means supply at least two kinds of coating liquids to the first nozzles.

9. The apparatus according to claim 1, wherein the at least one second nozzle has a nozzle port arranged in line with the nozzle ports of the first nozzles along the linear line.

10. The apparatus according to claim 1, wherein the at least one second nozzle has a nozzle port and a passage formed therein, the passage being bent such that the nozzle port is directed toward the nozzle ports of the first nozzles.

11. The apparatus according to claim 1, further comprising a nozzle moving mechanism for moving the second nozzle along the first nozzles and positioning the second nozzle adjacent to each of the first nozzles.

12. A coating apparatus comprising:

a spin chuck for holding and rotating a substrate;

a header unit movable along a linear line connecting a position just above a center-of-rotation of the substrate, to a home position of the unit along the linear line;

a plurality of first nozzles included in the header unit for discharging coating liquids to the substrate held on the spin chuck, the first nozzles having their respective nozzle ports arranged in line along the linear line;

a plurality of coating liquid supply means for supplying the coating liquids to the first nozzles, respectively;

a cover member defining an inner space around the nozzle ports of the first nozzles and protecting the nozzle ports from an outside atmosphere;

a slide lid attached to the lower surface of the cover member such that it can slide along the lower surface;

a plurality of first holes formed in the cover member such that they are aligned with the nozzle ports of the first nozzles, respectively; and a plurality of second holes formed in the slide lid with a pitch different from the pitch of the first holes;

wherein the slide lid is slided to thereby make one of the first holes communicating with one of the second holes and permit a coating liquid from one of the first nozzles to be discharged through the communicating ones of the first and second holes toward the substrate.

13. The apparatus according to claim 12, wherein the first holes are arranged with a predetermined pitch $P_1$, and the second holes are arranged with another predetermined pitch $P_2$ smaller than the predetermined pitch $P_1$.

14. The apparatus according to claim 12, wherein the first and second holes have substantially the same diameter larger than that of the nozzle ports of the first nozzles.

* * * * *